(12) United States Patent
Nakamura et al.

(10) Patent No.: US 7,138,698 B2
(45) Date of Patent: Nov. 21, 2006

(54) SEMICONDUCTOR DEVICE INCLUDING POWER MOS FIELD-EFFECT TRANSISTOR AND DRIVER CIRCUIT DRIVING THEREOF

(75) Inventors: Kazutoshi Nakamura, Yokohama (JP); Norio Yasuhara, Kawasaki (JP); Tomoko Matsudai, Tokyo (JP); Kenichi Matsushita, Tokyo (JP); Akio Nakagawa, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/007,254

(22) Filed: Dec. 9, 2004

(65) Prior Publication Data

US 2005/0179472 A1 Aug. 18, 2005

(30) Foreign Application Priority Data

Dec. 18, 2003 (JP) ............................. 2003-420771

(51) Int. Cl.
*H01L 23/58* (2006.01)
(52) U.S. Cl. .................. 257/491; 257/206; 257/E27.11
(58) Field of Classification Search ................ 257/369, 257/371, 401, 327, 328, 330, 331, 338, 341, 257/342, 202, 204, 206, 491, 492, 493, 531, 257/E27.11, E29.012
See application file for complete search history.

(56) References Cited

U.S. PATENT DOCUMENTS 6,278,264 B1 *  8/2001  Burstein et al. ............ 323/282
2004/0159891 A1   8/2004  Nakamura et al.

OTHER PUBLICATIONS

MAX1710 evaluations kit, "Products Catalogue: Maxim Integrated Products", Maxim Japan K.K., 1998, pp. 1-10.

* cited by examiner

*Primary Examiner*—Minhloan Tran
*Assistant Examiner*—Benjamin Tzu-Hung Liu
(74) *Attorney, Agent, or Firm*—Oblon, Spivak, McClelland, Maier & Neustadt, P.C.

(57) ABSTRACT

A semiconductor device comprises a high side switching element, a driver circuit, and a low side switching element. The high side switching element is formed on a first semiconductor substrate, has a current path to one end of which an input voltage is supplied, and the other end of the current path is connected to an inductance. The driver circuit is formed on the first semiconductor substrate, on which the high side switching element is formed, and drives the high side switching element. The low side switching element is formed on a second semiconductor substrate separate from the first semiconductor substrate, and has a drain connected to the inductance and a source supplied with a reference potential.

29 Claims, 18 Drawing Sheets

SEMICONDUCTOR DEVICE INCLUDING POWER MOS FIELD-EFFECT TRANSISTOR AND DRIVER CIRCUIT DRIVING THEREOF

CROSS-REFERENCE TO RELATED APPLICATIONS

This application is based upon and claims the benefit of priority from prior Japanese Patent Application No. 2003-420771, filed Dec. 18, 2003, the entire contents of which are incorporated herein by reference.

BACKGROUND OF THE INVENTION

1. Field of the Invention

This invention relates to a semiconductor device including a power MOS field-effect transistor (hereinafter referred to as "power MOSFET") and a driver circuit driving the power MOSFET. In particular, this invention relates to a non-insulated DC-DC converter for high-speed switching, including a power MOSFET and a driver circuit driving the power MOSFET.

2. Description of the Related Art

With reduction in voltages of power sources used for CPUs (central processing unit) of computers and the like, synchronous rectifying power sources have been in heavy use. Further, the current change rate (di/dt) required of power sources for CPUs is further increasing. Also to suppress ripples in output voltages of power sources, it is important to enhance the speed of power sources.

FIG. 1 shows a circuit diagram of a conventional DC-DC converter which transforms a direct-current voltage. In the conventional DC-DC converter, a high side MOS field-effect transistor (High Side FET) 101 formed of a discrete element, a low side MOS field-effect transistor (Low Side FET) 102 also formed of a discrete element, and a driver circuit 103 which drives them are enclosed in separate packages, and connected to one another on a printed circuit board (for example, please refer to MAX1710 evaluations kit, "Products Catalogue: Maxim Integrated Products", Maxim Japan K.K., 1998, p. 1–7).

However, as the current change rate (di/dt) increases, lowering of the conversion efficiency (output electric power/input electric power) due to parasitic inductance 104 on the printed circuit board and parasitic inductances 104 in packages caused by bonding wire are so large that it cannot be ignored.

Further, with increase in the speed, an output resistance of gate resistance and driver resistance existing in discrete elements causes decrease in the conversion efficiency of the DC-DC converter. The low side FET is turned on/off when the drain-source voltage is "0", and thus no switching loss occurs. In the meantime, the high side FET is turned on/off with change in the drain-source voltage, and thus switching loss occurs. Therefore, decrease in the conversion efficiency due to increase in the parasitic inductance and resistances is larger in the high side FET.

BRIEF SUMMARY OF THE INVENTION

A semiconductor device according to one aspect of the present invention comprises: a high side switching element formed on a first semiconductor substrate and having a current path to one end of which an input voltage is supplied, the other end of the current path being connected to an inductance; a driver circuit formed on the first semiconductor substrate, on which the high side switching element is formed, and driving the high side switching element; and a low side switching element formed on a second semiconductor substrate separate from the first semiconductor substrate, the low side switching element having a drain connected to the inductance and a source supplied with a reference potential.

DETAILED DESCRIPTION OF THE INVENTION

Figure 1:
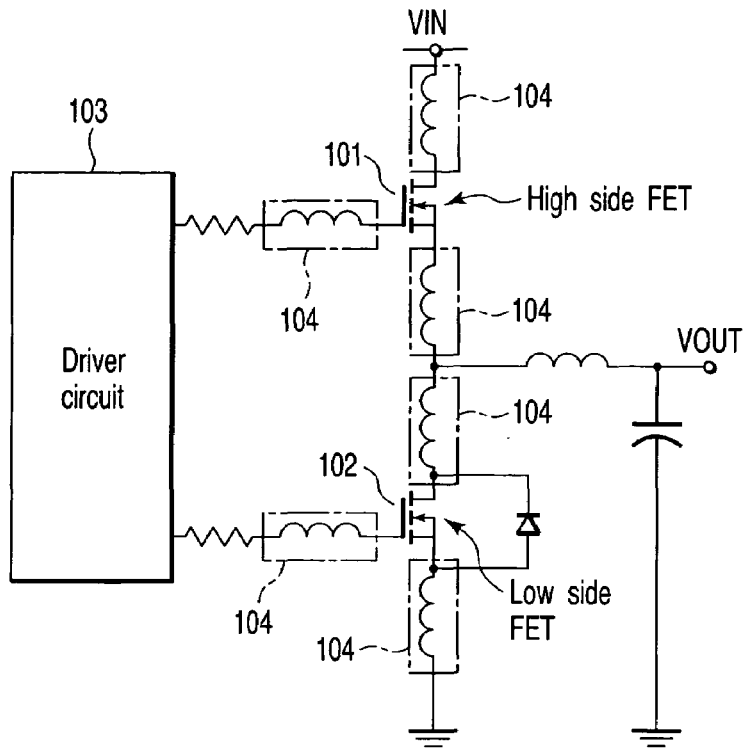
FIG. 1 is a circuit diagram of a conventional DC-DC converter which transforms a direct-current voltage.

Embodiments of the present invention will now be described with reference to drawings. In explanation, like reference numerals denote like constituent elements through all the drawings.

First Embodiment

First, a semiconductor device according to a first embodiment of the present invention is explained.

Figure 2A:
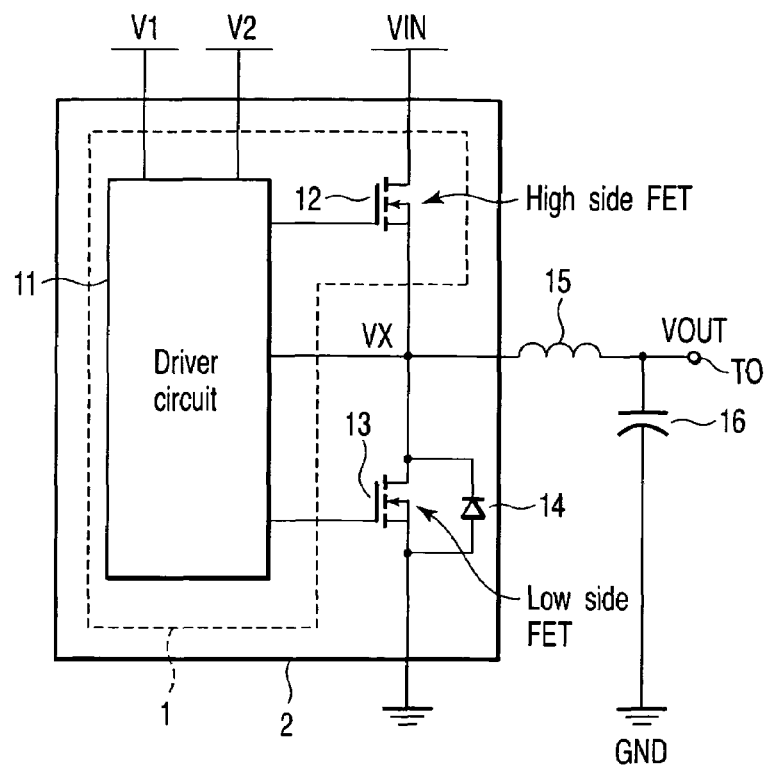
FIGS. 2A and 2B are circuit diagrams illustrating a structure of a DC-DC converter according to a first embodiment of the present invention.

FIG. 2A is a circuit diagram illustrating a structure of a DC-DC converter according to the first embodiment.

As shown in FIG. 2A, a driver circuit 11 is connected with a gate of a high side MOS field-effect transistor (hereinafter referred to as "high side switching element") 12 and a gate of a low side MOS field-effect transistor (hereinafter referred to as "low side switching element") 13. A diode 14 is connected between a drain and a source of the low side switching element 13. The driver circuit 11 has a function of turning on and off the high side switching element 12 and the low side switching element 13.

An inductance, for example, one end of a coil 15, is connected between a source of the high side switching element 12 and the drain of the low side switching element 13. The other end of the coil 15 is connected to an output terminal TO. A reference potential (for example, ground potential GND) is supplied to the other end of the coil 15 via a capacitor 16. The reference potential (ground potential GND) is supplied to the source of the low side switching element 13. Further, an input voltage VIN is input in a drain of the high side switching element 12, and an output voltage VOUT is output from the output terminal TO. Further, voltages V1 and V2 are supplied to the driver circuit 11. The voltage V1 is used for driving the high side switching element, and the voltage V2 is used for driving the low side switching element. The voltage V1 satisfies the expression V1>VX, where VX is a voltage between the source of the high side switching element 12 and the drain of the low side switching element 13. The voltage V1 is generated by a bootstrap circuit or a charge pump circuit.

Figure 2B:
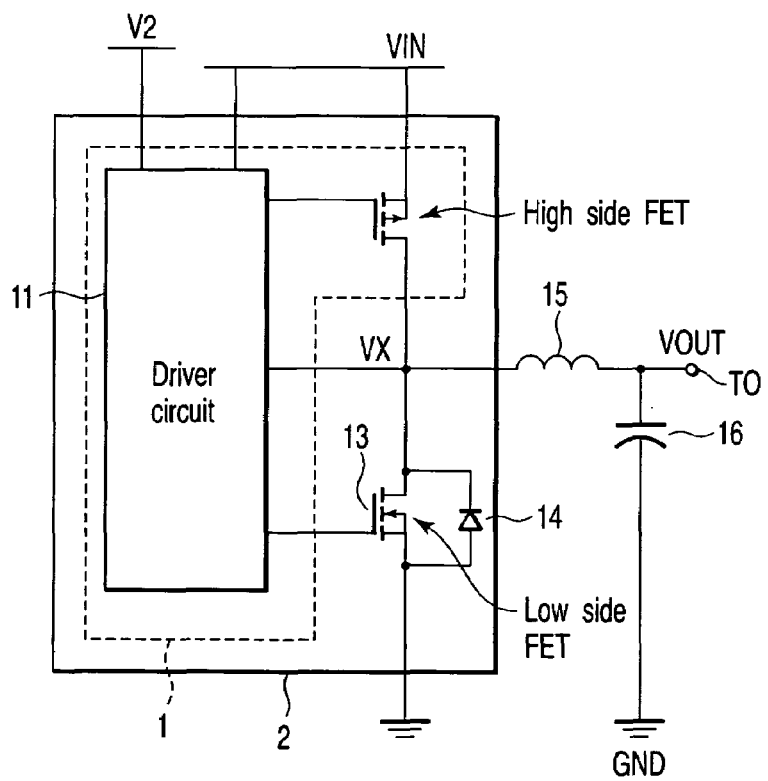

In such a circuit configuration, the driver circuit 11 and the high side switching element 12 are formed on the same semiconductor substrate 1, shown by an enclosed dotted line. Specifically, the driver circuit 11 and the high side switching element 12 are formed in a monolithic manner. FIG. 2A illustrates the case where the high side switching element is an n-channel MOS field-effect transistor (hereinafter referred to as "n MOSFET"). In the meantime, FIG. 2B illustrates the case where the high side switching element is a p-channel MOS field-effect transistor (hereinafter referred to as "p MOSFET"). In the structure shown in FIG. 2B, it is unnecessary to supply the voltage V1 to the driver circuit 11, but it is necessary to supply the input voltage VIN instead.

Figure 3:
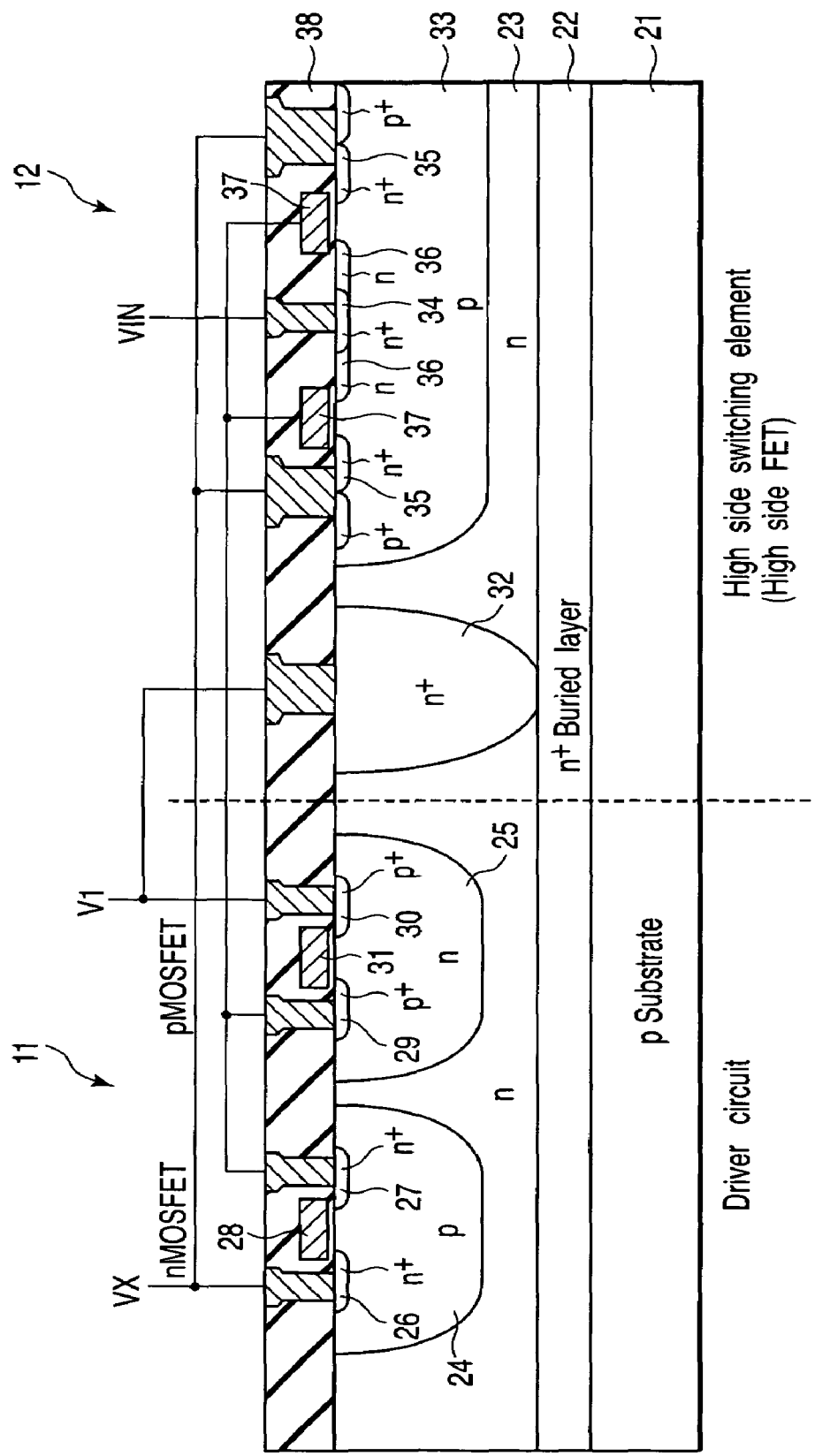
FIG. 3 is a cross-sectional view of a driver circuit and a high side switching element, which are formed on the same semiconductor substrate in the DC-DC converter of the first embodiment.

FIG. 3 is a cross-sectional view of a part of the high side switching element 12 and the driver circuit 13 driving the element, which are formed on the same semiconductor substrate, if an n MOSFET is used as the output element.

As shown in FIG. 3, an $n^+$ type buried layer 22 is formed on a p type semiconductor substrate 21. An n type layer 23 is formed on the $n^+$ type buried layer 22. In the n type layer 23, a p type well layer 24 and an n type well layer 25 are formed in a region in which a driver circuit is to be formed.

In a surface region of the p type well layer 24, an $n^+$ type layer serving as a source region 26 and an $n^+$ type layer serving as a drain region 27 are formed apart from each other. A gate electrode 28 is formed, with a gate insulating film interposed, above the p type well layer (channel region) 24 between the source region 26 and the drain region 27.

In a surface region of the n type well layer 25, a $p^+$ type layer serving as a drain region 29 and a $p^+$ type layer serving as a source region 30 are formed apart from each other. A gate electrode 31 is formed, with a gate insulating film interposed, above the n type well layer (channel region) 25 between the drain region 29 and the source region 30.

Further, in the n type layer 23, an $n^+$ type well layer 32 and a p type well layer 33 are formed in a region in which the high side switching element is formed. In a surface region of the p type well layer 33, an $n^+$ type layer serving as a drain region 34 and $n^+$ type layers serving as source regions 35 are formed apart from one another. On the both sides of the drain region 34, n type layers serving as resurf layers 36 are formed. A gate electrode 37 is formed, with a gate insulating film interposed, above the p type well layer (channel regions) 33 between the resurf layer 36 and the source region 35.

An interlayer insulation film 38 is formed on the above structure. In the interlayer insulation film 38, respective electrodes connected to the source regions, drain regions, and the $n^+$ type layer 32 are formed.

Further, as shown in FIGS. 2A and 2B, in the embodiment, the high side switching element 12 and the driver circuit 11, which are formed on the same semiconductor substrate, and the low side switching element 13 are formed in the same package 2 shown by an enclosed solid line.

Since the low side switching element 13 has a large influence on the conduction loss, the element is desired to have a low on-state resistance. Therefore, as the low side switching element 13, used is a discrete element, for example, a vertical MOSFET such as a trench type MOS field-effect transistor (hereinafter referred to as "trench MOSFET"). This is because a trench MOSFET has an on-state resistance lower than that of a lateral MOSFET formed of a power IC, if the withstand voltage is about 30V. In such a case, forming the trench MOSFET and the high side switching element on the same semiconductor substrate is not advisable, since it complicates the process. The trench MOSFET is a MOSFET having a trench gate structure in which a gate electrode is buried in a trench formed in a semiconductor layer and the semiconductor layer on side walls of the trench is used as a channel. A vertical MOSFET is a MOSFET in which a current passes from the front surface to the rear surface of the semiconductor substrate.

Figure 4:
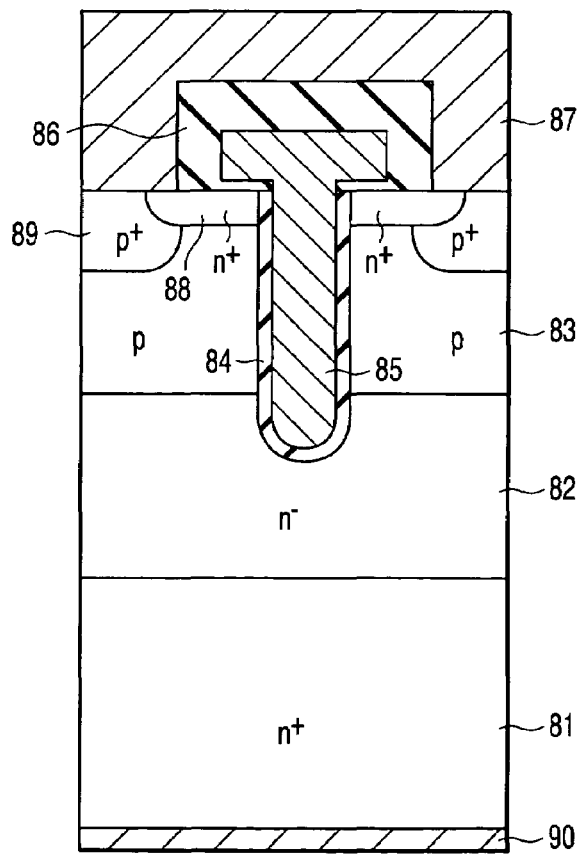
FIG. 4 is a cross-sectional view of a low side switching element in the DC-DC converter of the first embodiment.

FIG. 4 is a cross-sectional view of a trench MOSFET forming the low side switching element 13. An $n^-$ type layer 82 is formed on an $n^+$ type layer 81, and a p type layer 83 is formed on the n⁻ type layer 82. A trench is formed in the p type layer 83, and a gate electrode 85 is formed in the trench with a gate insulation film 84 interposed therebetween. A source electrode 87 is formed on the gate electrode 85, with an insulation film 86 interposed therebetween. In a surface region of the p type layer 83, an n⁺ type layer serving as a source region 88 is formed to contact the source electrode 87 and the gate insulation film 84, and p⁺ type layers 89 are formed under the source electrode 87. Further, as shown in FIG. 4, a drain electrode 90 is formed on a lower surface of the n+ type layer 81. In the first embodiment, the high side switching element 12 and the driver circuit 11 are formed in a monolithic manner. This shortens the wiring route, and suppresses decrease in the conversion efficiency due to parasitic inductances and resistances caused by the printed circuit board and bonding. Further, since the low side switching element 13 is desired to have a low one-state resistance, it is formed of a discrete element.

As described above, according to the first embodiment, the high side switching element and the driver circuit are formed on a first chip, and the low side switching element is formed on a second chip. Thereby, it is possible to reduce the influence of the parasitic inductance and resistance caused by the printed circuit board and bonding. Further, the separate chips are contained in the same package, and thereby the influence of the parasitic inductance can be reduced to a minimum. These features can suppress decrease in the conversion efficiency in the DC-DC converter.

Second Embodiment

Next, a semiconductor device according to a second embodiment of the present invention is explained.

Figure 5:
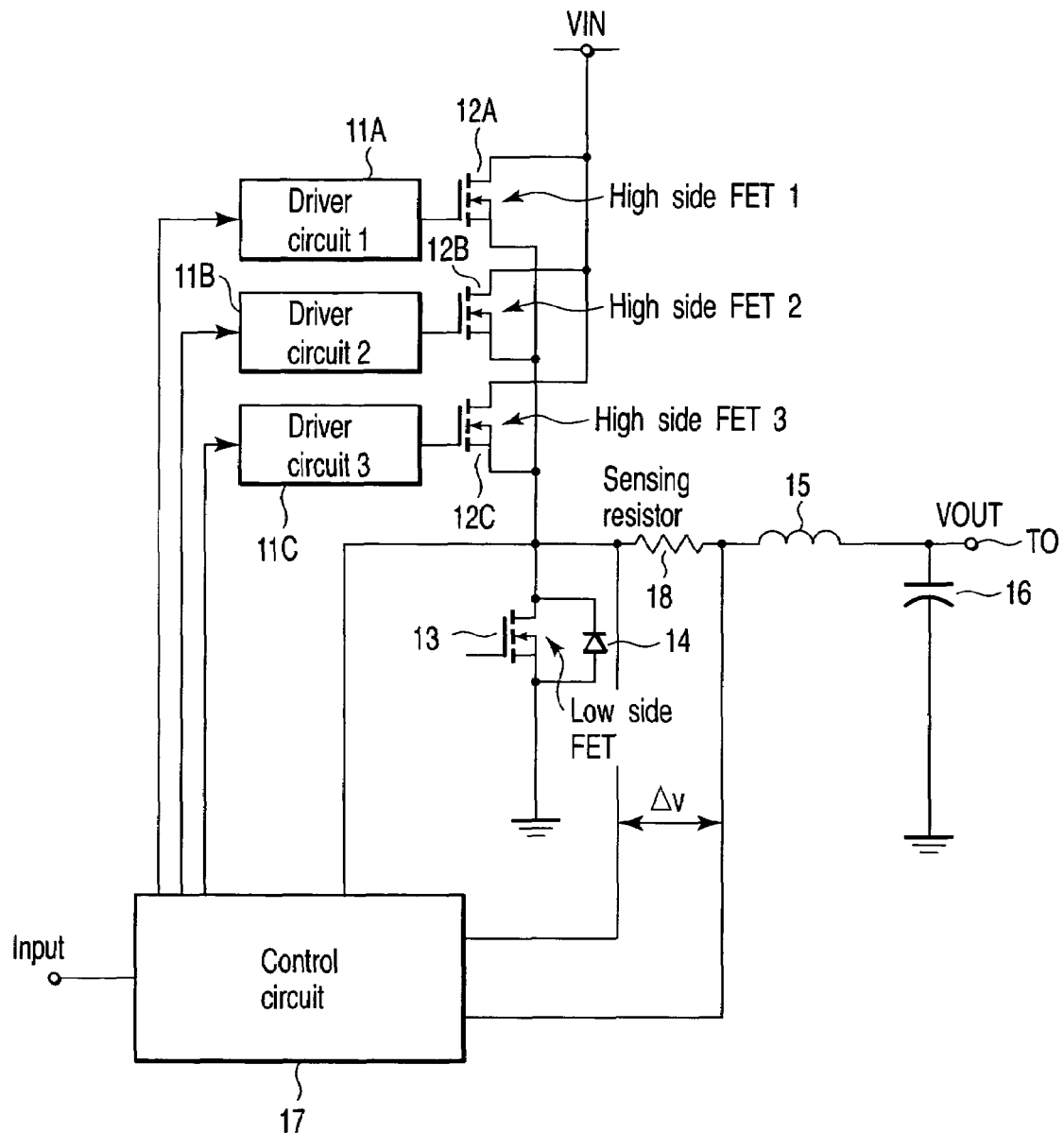
FIG. 5 is a circuit diagram illustrating a structure of a DC-DC converter according to a second embodiment of the present invention.

FIG. 5 is a circuit diagram illustrating a structure of a DC-DC converter of the second embodiment.

In the second embodiment, at least two divided high side switching elements are used. For example, three high side switching elements 12A, 12B and 12C are provided, and driver circuits 11A, 11B and 11C are individually provided for the respective switching elements. In such a structure, active regions of the plural divided high side switching elements are changed according to a current flowing through a load connected to an output terminal TO.

As shown in FIG. 5, a control circuit 17 is connected with the three driver circuits 11A, 11B and 11C. the driver circuits 11A, 11B and 11C are connected to respective gates of the high side switching elements 12A, 12B and 12C, respectively. A sensing resistor 18 is connected between one end of a coil 15 and a part between a source of the high side switching element 12C and a drain of a low side switching element 13. Further, the one end and the other end of the sensing resistor 18 are connected to the control circuit 17.

In the above circuit configuration, a current flowing through the load connected to the output terminal TO is monitored with the sensing resistor 18. Assuming that predetermined voltages V2 and V3 satisfy the expression V2>V3, if a value of a voltage drop ΔV generated on the sensing resistor 18 is equal to or larger than the voltage V2, all the three divided high side switching elements 12A, 12B and 12C are driven. If the value of the voltage drop ΔV is equal to or larger than the voltage V3 and smaller than the voltage V2, the two high side switching elements 12A and 12B in the divided high side switching elements are driven. If the voltage drop ΔV is smaller than the voltage V3, only one high side switching element 12A is driven.

By the above structure, if the load current flowing from the output terminal TO is small, it is possible to reduce the drive loss (electric power used for driving the gate capacity of the high side switching elements) in the gates of the high side switching elements. In the above structure, the current is sensed, and the sensing result is sent as feedback to the control circuit 17. Feedback based on the variation of the output voltage VOUT from its set value can be applied. As a result, it is possible to suppress decrease in the conversion efficiency in the DC-DC converter during low-load conditions.

Third Embodiment

Next, a semiconductor device according to a third embodiment of the present invention is explained.

Figure 6:
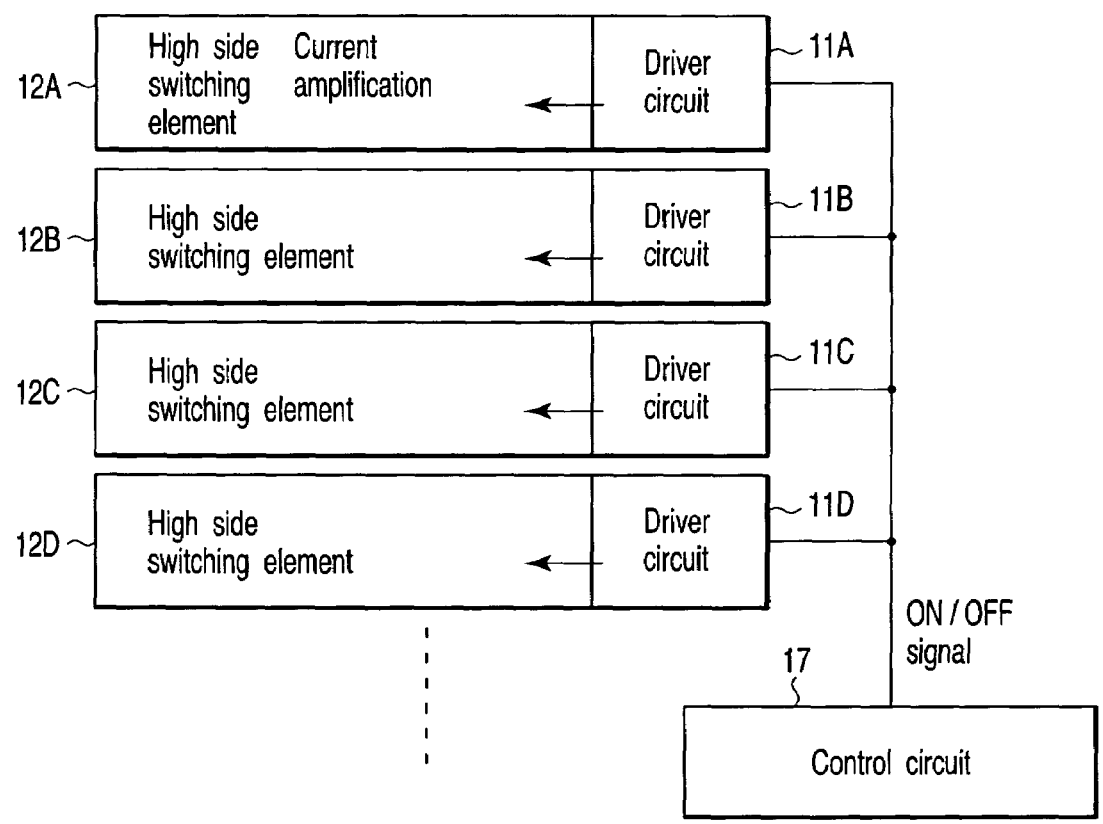
FIG. 6 is a circuit diagram illustrating a structure of a DC-DC converter according to a third embodiment of the present invention.

FIG. 6 is a circuit diagram illustrating a structure of a DC-DC converter according to the third embodiment.

As shown in FIG. 6, driver circuits 11A, 11B, 11C and 11D for driving high side switching elements 12A, 12B, 12C and 12D, respectively, are arranged in the vicinity of the respective switching elements 12A, 12B, 12C and 12D. The driver circuits 11A, 11B, 11C and 11D are circuits which turn on and off at least the respective high side switching elements. A control circuit 17 which controls the driver circuits 11A, 11B, 11C and 11D may not be disposed in the vicinity of the driver circuits.

In the conventional art, a driver circuit which drives a high side switching element and a control circuit which controls the driver circuit are arranged adjacent to each other in one place. Therefore, if a gate electrode of the high side switching element is charged or discharged, current concentration inevitably occurs in a wire connecting the driver circuit to the gate of the high side switching element. The embodiment shown in FIG. 6 distributes a current which drives the gate electrodes of the high side switching elements, and thereby can reduce the influence of wiring resistance. Thereby, the embodiment can suppress decrease in the conversion efficiency in the DC-DC converter.

Figure 7A:
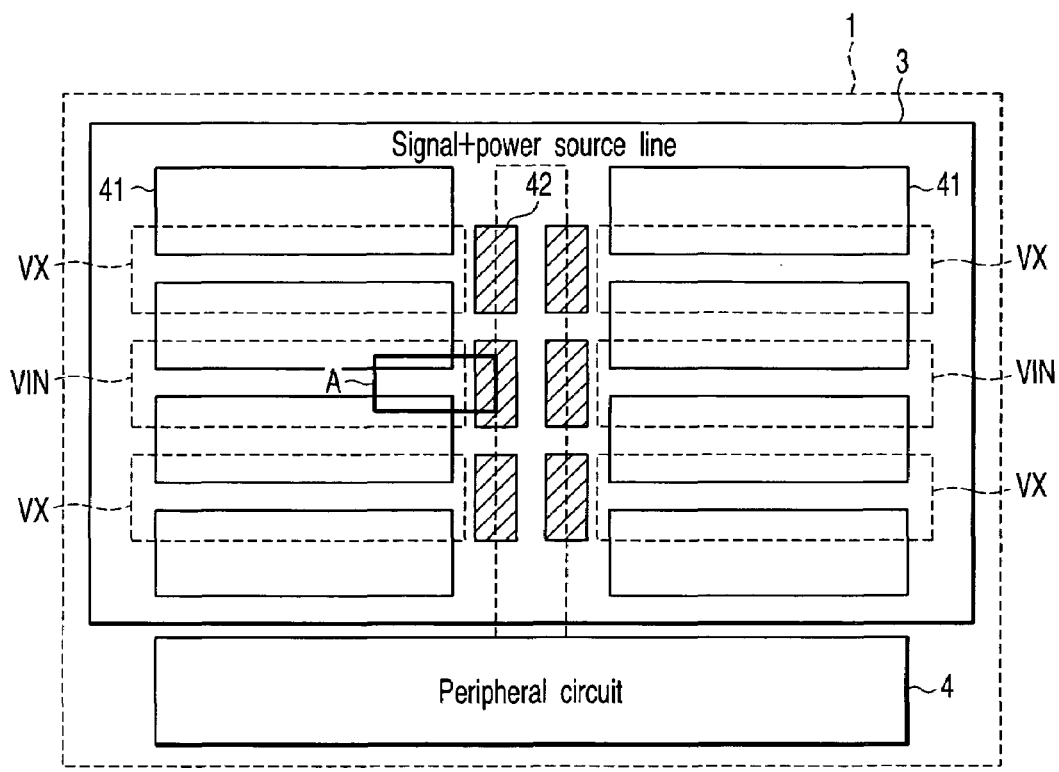
FIGS. 7A and 7B are layout diagrams each illustrating a specific structural example of high side switching elements and driver circuits in the DC-DC converter of the third embodiment.

FIG. 7A is a layout diagram illustrating a specific structural example of the high side switching elements and the driver circuits.

As shown in FIG. 7A, on a semiconductor substrate 1, provided are a rectangular high side switching region 3 including all high side switching elements and having a minimum area, and a peripheral circuit 4.

In FIG. 7A, in the left region in the region 3, a plurality of high side element regions 41, in each of which high side switching elements are formed, are arranged in a column direction. Also in the right region in the region 3, a plurality of high side element regions 41, in each of which high side switching elements are formed, are arranged in the column direction. A plurality of driver circuits 42, which drive high side switching elements formed in the high side element regions 41, are arranged in an area between the left and the right high side element regions 41. At least 50% of the area of each of the driver circuits 42 is located in the high side switching region.

Figure 7B:
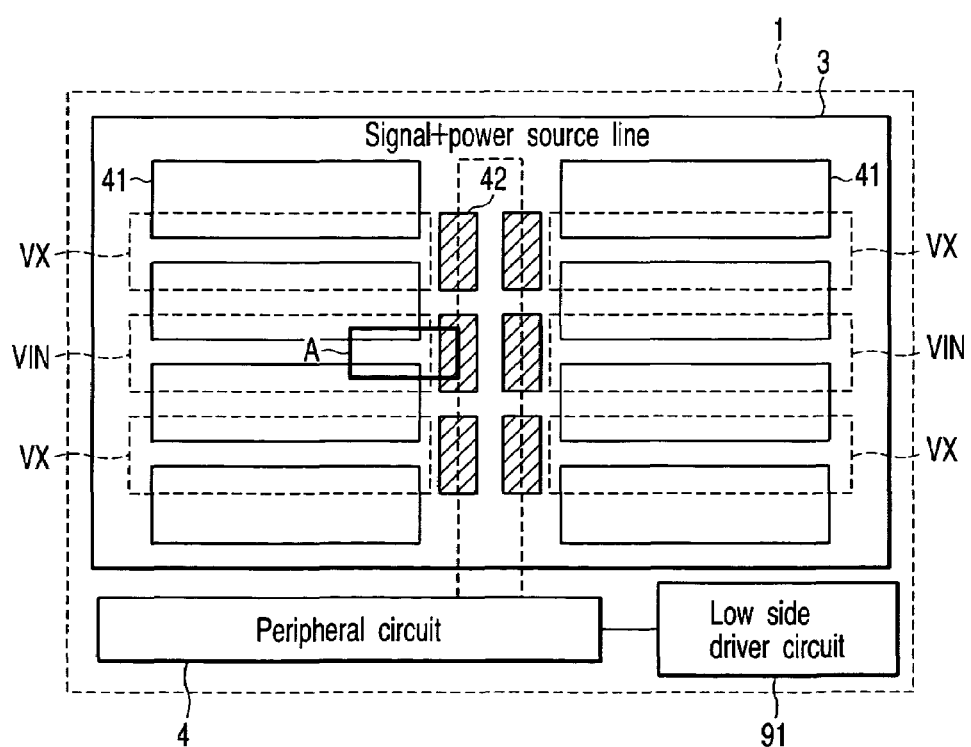

Further, wires VIN connected to drains of the high side switching elements and wires VX connected to sources of the high side switching elements are formed above the high side element regions 41. The peripheral circuit 4 includes a control circuit that controls the driver circuits 42. Further, as shown in FIG. 7B, a driver circuit 91 that drives a low side switching element may be formed on the semiconductor substrate 1, besides the peripheral circuit 4.

Figure 8:
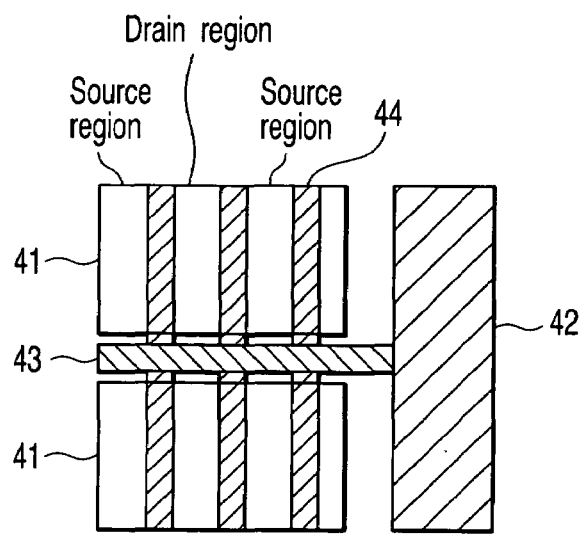
FIG. 8 is an enlarged layout diagram of a region A in FIG. 7A.

FIG. 8 is an enlarged layout diagram of a region A in FIG. 7A. As shown in FIG. 8, a driver circuit 42 is disposed adjacent to high side element regions 41. Further, a wire 43 connected to the driver circuit 42 is disposed between the high side element regions 41. Gate electrodes 44 are extended from the wire 43. In such a manner, each driver circuit controls gate electrodes of high side switching elements.

Figure 9:
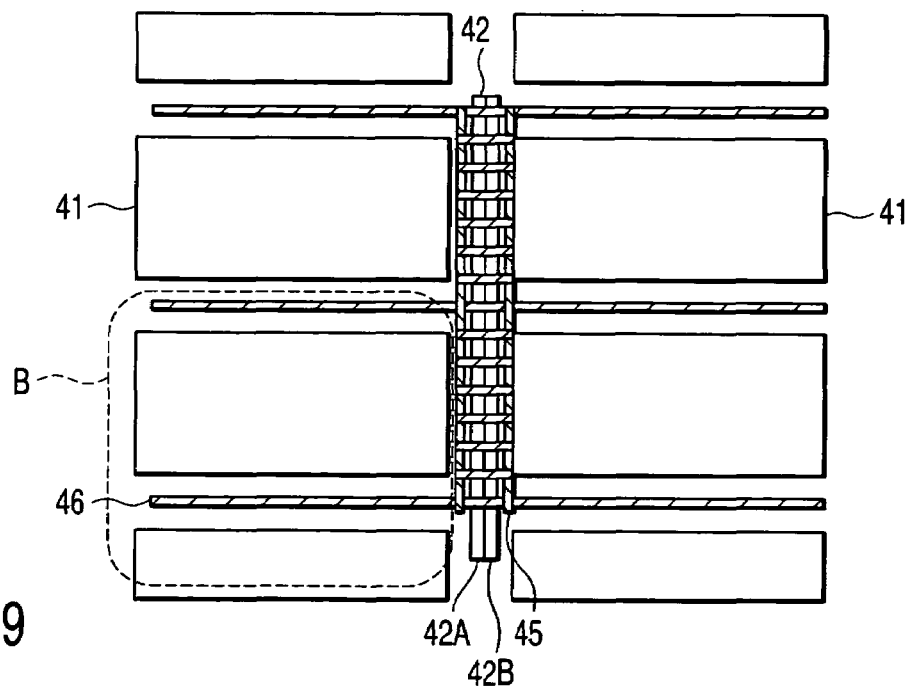
FIG. 9 is a layout diagram illustrating another specific structural example of the high side switching elements and the driver circuit in the DC-DC converter of the third embodiment.
Figure 10:
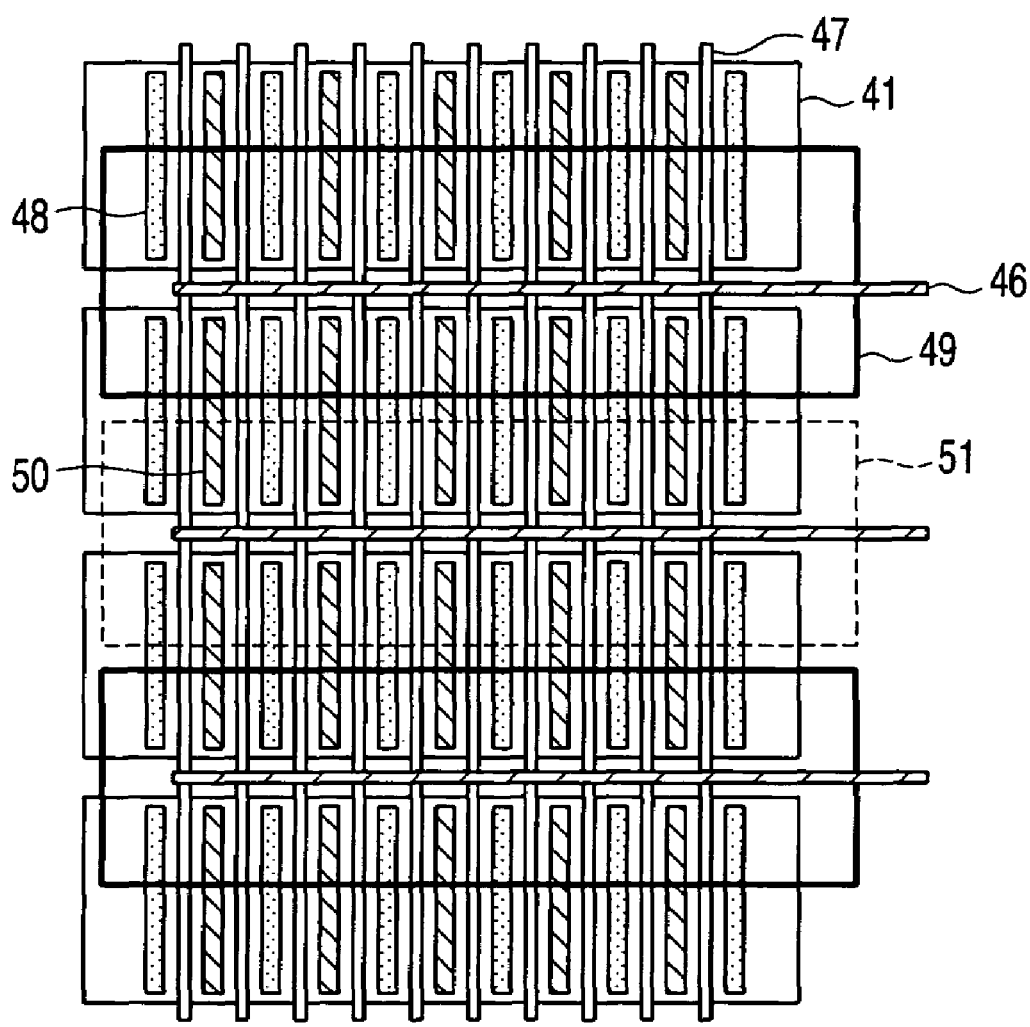
FIG. 10 is an enlarged layout diagram of a region B in FIG. 9.

FIG. 9 is a layout diagram illustrating another specific structural example of the high side switching elements and the driver circuits. FIG. 10 is an enlarged layout diagram of a region B in FIG. 9.

As shown in FIG. 9, in the left half of the drawing, a plurality of high side element regions 41, in each of which high side switching elements are formed, are arranged in the column direction. Also in the right half, a plurality of high side element regions 41 are arranged in the column direction. The last stages (switching circuit) of driver circuits 42 which drive the high side switching elements are disposed between the left high side element regions 41 and the right high side element regions 41. In other words, the plurality of high side element regions 41 are arranged in rows and columns, and the driver circuits 42 which amplify a current and drive the high side switching elements are disposed between the high side element regions 41 around the center.

The last stages of the driver circuits 42 are switching circuits, each of which comprising a p channel MOS field-effect transistor (hereinafter referred to as "p MOSFET") 42A and an n channel MOS field-effect transistor ("n MOSFET") 42B. Drains of the p MOSFETs 42A and n MOSFETs 42B are connected to common electrodes 45.

As shown in FIGS. 9 and 10, the common electrodes 45 are connected with wires 46, each of which is formed between two adjacent high side element regions 41. Further, the wires 46 are connected with gate wires 47 which form gate electrodes of the high side switching elements formed in the high side element regions 41. Thereby, the wiring to the gate electrodes of the high side switching elements is shortened, and thus it is possible to suppress the gate resistance. The gate wires 47 are formed of polysilicon, for example.

Further, above the high side element regions 41 and the wires 46, formed are source electrode layers (the wire VX) 49 to which sources 48 of the high side switching elements are connected, and drain electrode layers (the wires VIN) 51 to which drains 50 of the high side switching elements are connected. The source electrode layers 49 are connected to the source of the n MOSFET 42B in the last stage of the driver circuit 42.

As described above, the source electrode layers 49 connected to the sources of the high side switching elements on the both sides of the respective layers are formed directly above the high side element regions 41, and the source of the n MOSFET 42B of the last stage in the driver circuit 42 is directly connected to the source electrode layers 49. Thereby, the influence of the inductance can be reduced. Specifically, distributing the path for driving the gates into plural paths can prevent concentration of the current, and reduce the parasitic inductance. Therefore, it is possible to suppress decrease in the conversion efficiency in the DC-DC converter.

Fourth Embodiment

Next, a semiconductor device according to a fourth embodiment of the present invention is explained.

Figure 11A:
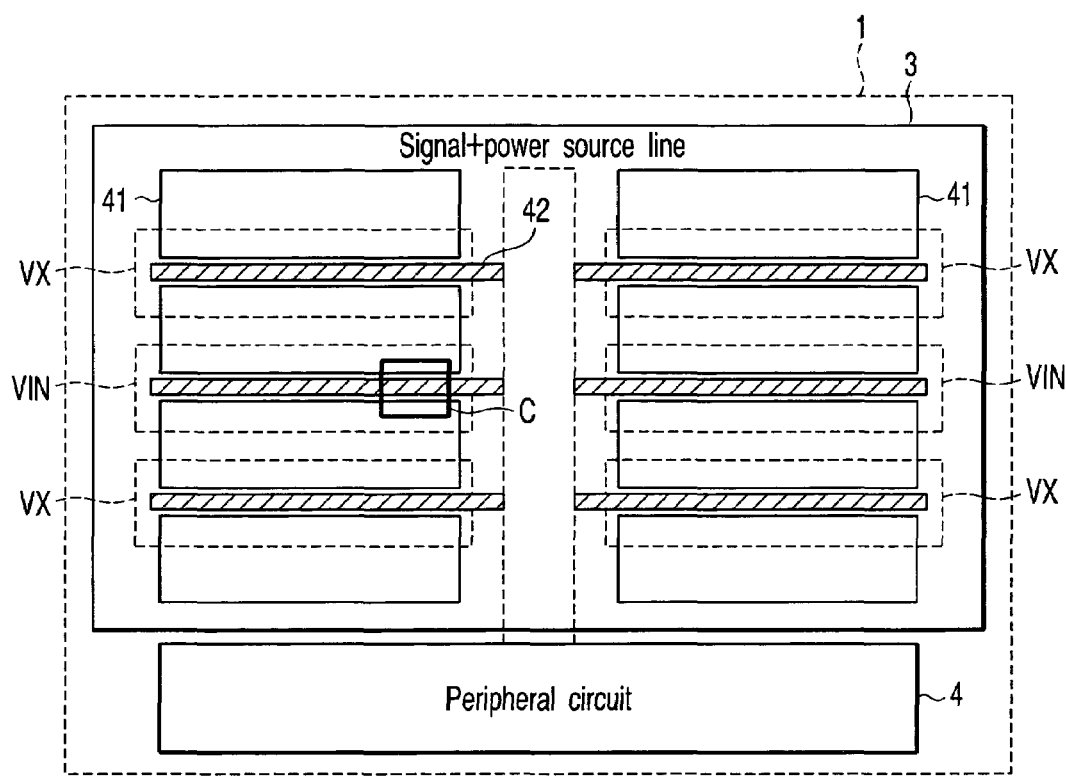
FIGS. 11A and 11B are layout diagrams each illustrating a specific structural example of high side switching elements and driver circuits in a DC-DC converter according to a fourth embodiment of the present invention.
Figures 12, 13:
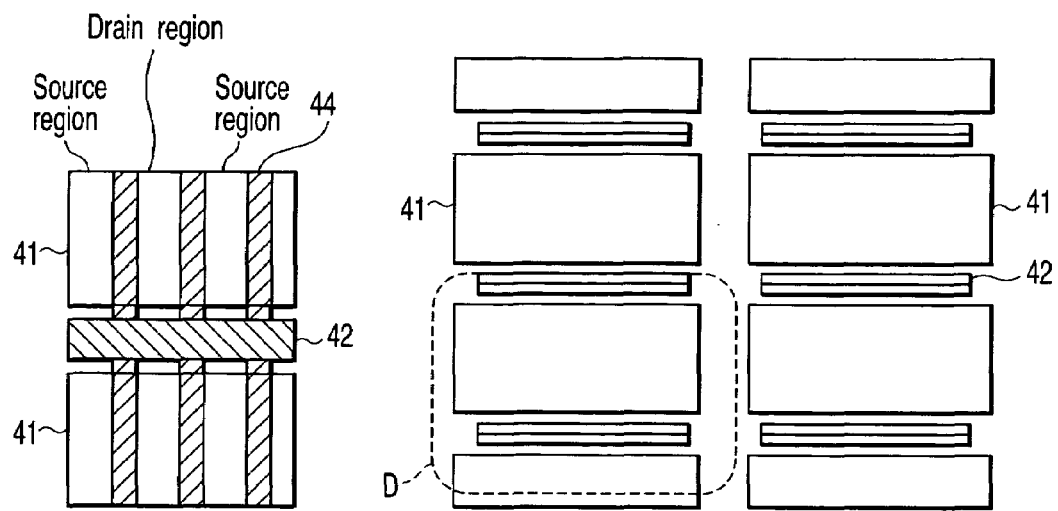
FIG. 12 is an enlarged layout diagram of a region C in FIG. 11A.
FIG. 13 is a layout diagram illustrating another specific structural example of high side switching elements and driver circuits in the DC-DC converter of the fourth embodiment.

FIG. 11A is a layout diagram illustrating a specific structural example of high side switching elements and driver circuits in a DC-DC converter of the fourth embodiment. FIG. 12 is an enlarged layout diagram of a region C in FIG. 11A.

Also in the fourth embodiment, shown is an example of using an n MOSFET as a high side switching element. In the above third embodiment, the driver circuit 42 is disposed in an area between the plural left high side switching element regions and the plural right high side switching element regions. In the fourth embodiment, driver circuits are arranged between respective adjacent left high side switching element regions, and between respective adjacent right high side switching element regions.

Figure 11B:
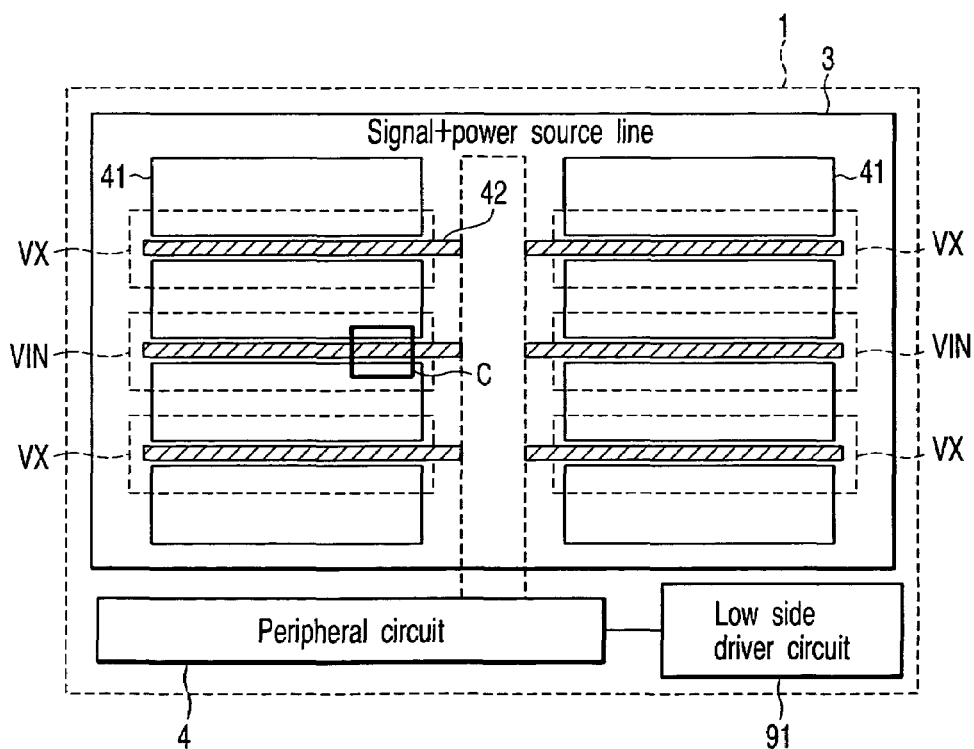

As shown in FIG. 11A, driver circuits 42 are arranged in respective areas between adjacent high side switching element regions 41 arranged in the column direction on the left side. Driver circuits 42 are also arranged in respective areas between adjacent high side switching element regions 41 arranged in the column direction on the right side. Further, a peripheral circuit 4 includes a control circuit that controls the driver circuits 42. As shown in FIG. 11B, a driver circuit 91 that drives a low side switching element may be formed on the semiconductor substrate 1, besides the peripheral circuit 4.

Further, as shown in FIG. 12, each driver circuit 42 is connected with gate wires 44, which form gate electrodes of respective high side switching elements formed in the adjacent high side switching regions 41. Thereby, the wiring to the gate electrode of each high side switching element is reduced, and the gate resistance can be reduced. The gate wires 44 are formed of polysilicon. Further, the wires VIN connected to drains of the high side switching elements and wires VX connected to sources of the high side switching elements are formed above the high side switching elements 41 and the driver circuits 42.

Figure 14:
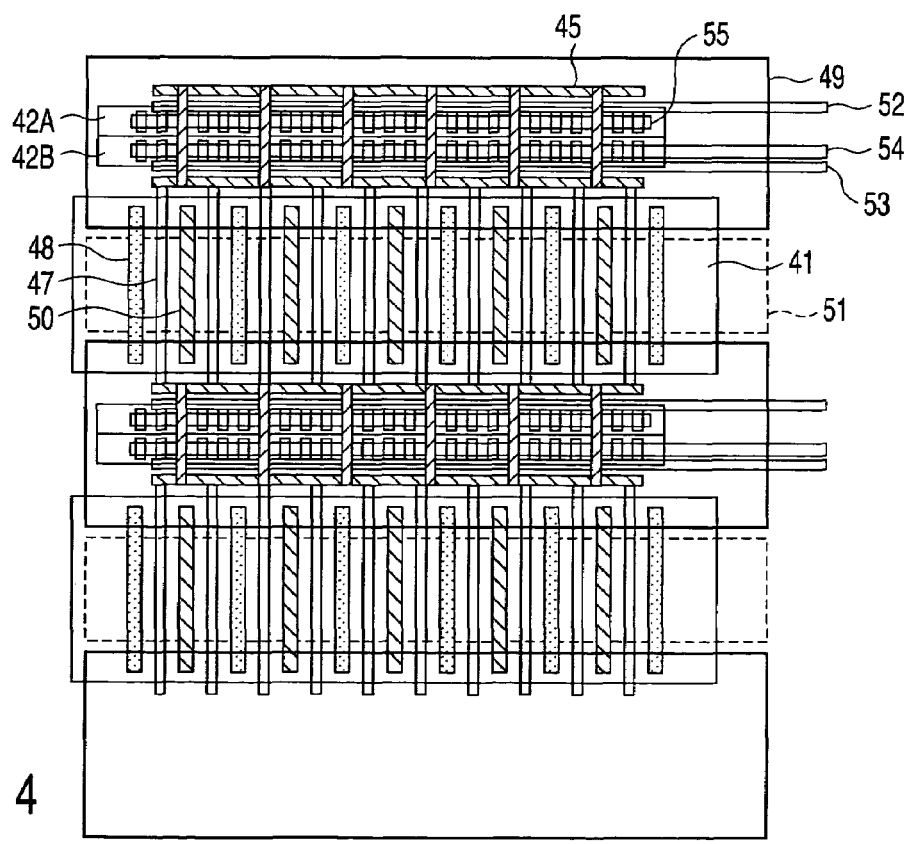
FIG. 14 is an enlarged layout diagram of a region D in FIG. 13.

FIG. 13 is a layout diagram of another specific structural example of the high side switching elements and the driver circuits, and FIG. 14 is an enlarged layout diagram of a region D in FIG. 13.

As shown in FIG. 13, the last stages (switching circuits) of driver circuits 42 formed of p MOSFETs and n MOSFETs are arranged between respective adjacent high side element regions 41 arranged in the column direction on the left side, and between respective adjacent high side element regions 41 arranged in the column direction on the right side. In other words, two or more divided high side element regions are arranged in rows and columns. Further, for example, elongated last stages of the driver circuits 42 which amplify a current and drive the high side switching elements are arranged between respective areas between adjacent left high side switching elements 41, and respective areas between adjacent right high side switching elements 41.

As shown in FIG. 14, the last stage of each drive circuit 42 is formed of an n MOSFET 42B and a p MOSFET 42A, and forms a switching circuit. Drains of the n MOSFET 42B and the p MOSFET 42A are connected to a common electrode 45.

To the common electrodes 45, connected are gate wires 47 forming gate electrodes of high side switching elements formed in the high side element regions 41. Thereby, wiring to the gate electrodes of the high side switching elements is reduced, and the gate resistance can be reduced. The gate wires 47 are formed of, for example, polysilicon.

Further, above the high side element regions 41 and the driver circuits 42, formed are source electrode layers (the wire VX) 49 connected with sources 48 of the high side switching elements, and drain electrode layers (the wire VIN) 51 connected with drains 50 of the high side switching elements. The source electrode layers 49 are connected to the sources of the respective n MOSFETs 42B of the last stages of the driver circuits 42.

On each of the driver circuits 42, formed is a wire 52 connected to the gate of the n MOSFET 42A, and wire 53 connected to the gate of the p MOSFET 42B. Further, on each of the driver circuits 42, formed are wire 55 which supplies power supply voltage to the source of the p MOSFET 42A, and wire 54 which supplies a reference potential (for example, ground potential) to the source of the n MOSFET 42B.

As described above, a source electrode layer 49 connected to the sources of the adjacent high side switching elements on the both sides is formed directly above the last stage of the driver circuit, and the source of the n MOSFET 42B at the last stage of the driver circuit 42 is directly connected to the source electrode layer 49. This reduces the influence of inductance. In other words, the parasitic inductance is reduced, and decrease in the conversion efficiency of the DC-DC converter is suppressed.

Figure 15:
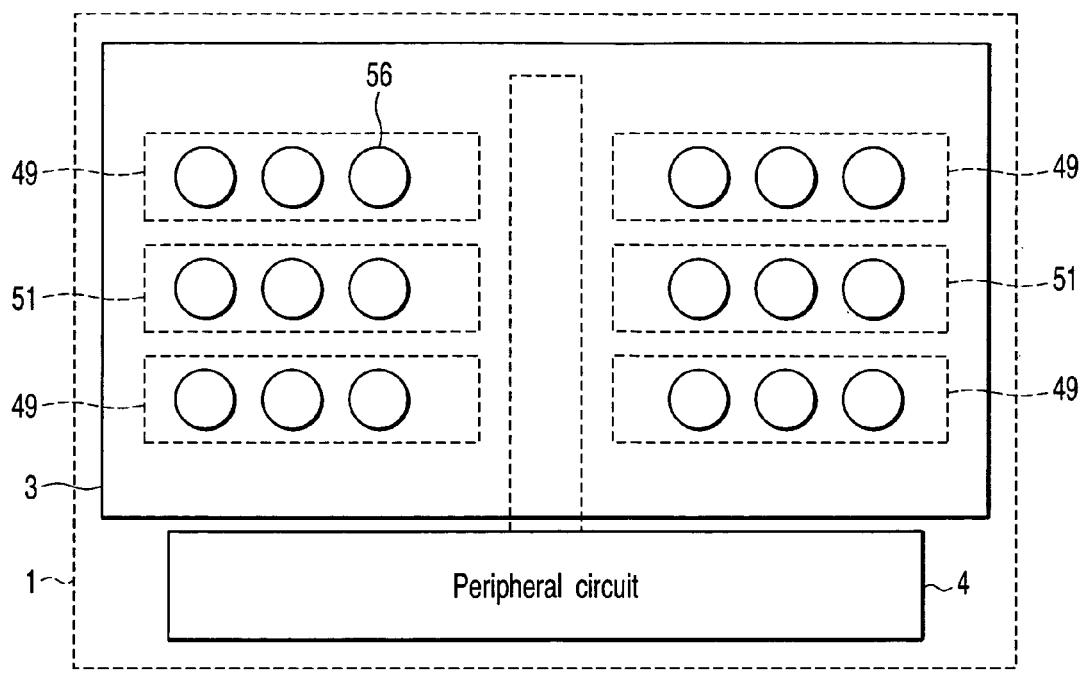
FIG. 15 is a layout diagram illustrating arrangement of electrodes in the DC-DC converter of the fourth embodiment.

FIG. 15 is a layout diagram illustrating arrangement of electrodes in the semiconductor device of the above fourth embodiment.

As shown in FIG. 15, the source electrode layers 49 and the drain electrode layers 51 are formed on the semiconductor device (chip) 1 in which the high side switching elements and the driver circuits are formed. A plurality of bumps 56 are formed on each of the source electrode layers 49 and the drain electrode layers 51. The bumps 56 electrically connect the semiconductor device 1 to a printed circuit board or the like. This can reduce the parasitic inductance in comparison with the case of routing wire, and suppress decrease in the conversion efficiency in the DC-DC converter.

Fifth Embodiment

Next, a semiconductor device according to a fifth embodiment of the present invention is explained.

Figure 16:
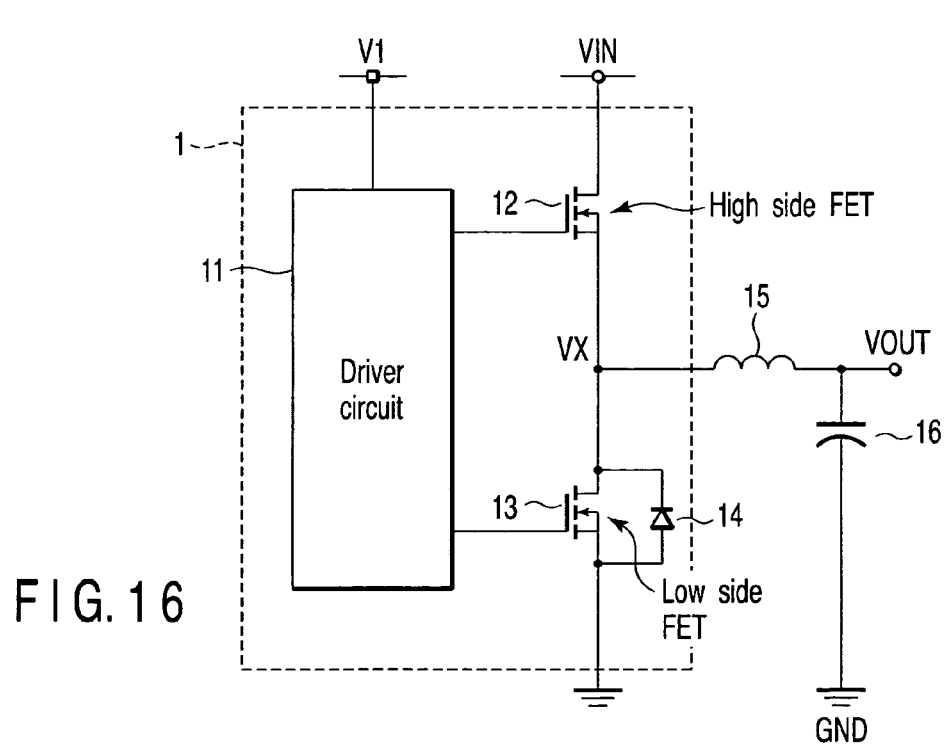
FIG. 16 is a circuit diagram illustrating a structure of a DC-DC converter according to a fifth embodiment of the present invention.

FIG. 16 is a circuit diagram illustrating a structure of a DC-DC converter according to the fifth embodiment of the present invention.

In the fifth embodiment, a low side switching element 13, a high side switching element 12 and a driver circuit 11 are formed on the same semiconductor substrate 1.

If the supply current of the DC-DC converter is small, it is unnecessary to lessen the on-state resistance of the low side switching element 13. Therefore, the low side switching element 13 can also be formed on the same semiconductor substrate (chip), on which the high side switching element 12 and the driver circuit 11 are formed. This structure can further reduce the parasitic inductance in comparison with the embodiment shown in FIG. 1, and suppress the decrease in the conversion efficiency in the DC-DC converter.

Figure 17:
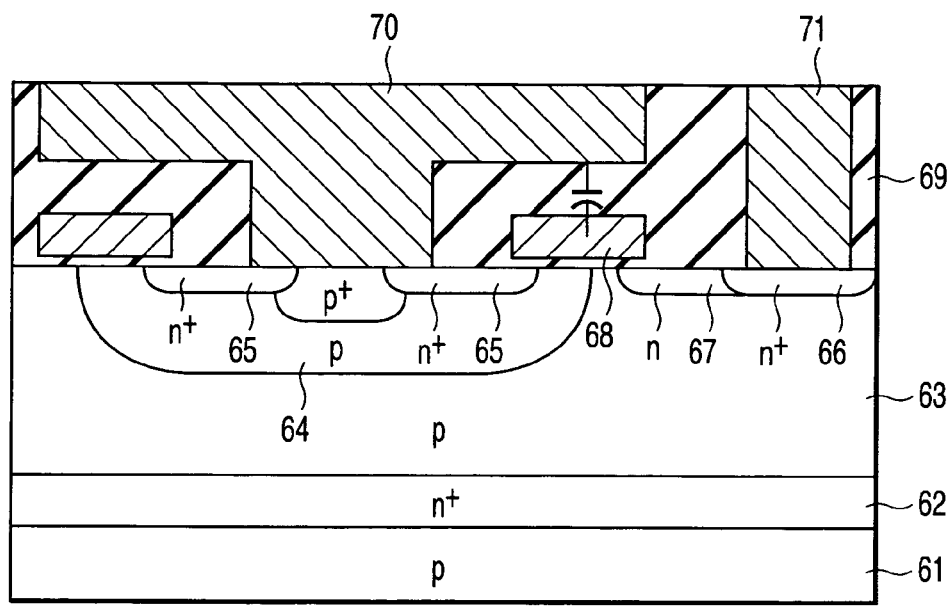
FIG. 17 is a cross-sectional view of a first example of a low side switching element in the DC-DC converter of the fifth embodiment.

The following is an explanation of a cross-sectional structure of the low side switching element 13 in the semiconductor devices of the first to fifth embodiments. The explanation is made with an example in which the low side switching element 13 is formed of a lateral MOS field-effect transistor. FIG. 17 is a cross-sectional view of a first example of the low side switching element in the DC-DC converter of the fifth embodiment.

As shown in FIG. 17, an $n^+$ type buried layer 62 is formed on a p type semiconductor substrate 61. A p type layer 63 is formed on the $n^+$ type buried layer 62. In the p type layer 63, a p type well layer is formed as a base region 64. In a surface region of the base region 64, $n^+$ type layers are formed as source regions 65. In a surface region of the p type layer 63, an $n^+$ type layer serving as a drain region 66 is formed apart from the source regions 65. A resurf layer (n type layer) 67 contacting the drain region 66 is formed between the source region 65 and the drain region 66.

A gate electrode 68 is formed over the base region 64 and the p type layer (channel region) 63 which are located between the source region 65 and the resurf layer 67, with a gate insulation film interposed therebetween.

On the above structure, an interlayer insulation film 69 is formed. In the interlayer insulation film 69, source electrode 70 which is electrically connected to the source regions 65 is formed on the source regions 65. Further, in the interlayer insulation film 69, a drain electrode 71 which is electrically connected to the drain region 66 is formed on the drain region 66. The source electrode 70 is formed to cover the gate electrode 68. In other words, the gate electrode 68 and the source electrode 70 are arranged to vertically overlap each other with respect to the surface of the semiconductor substrate. Such arrangement increases the capacity between the gate electrode 68 and the source electrode 70.

The low side switching element 13 is required to have a small "capacity Crss/capacity Ciss", from the viewpoint of self turn-on. The term "self turn-on" means that the low side switching element 13 is turned on, when the element is in the OFF state, according to the voltage change rate (dv/dt) of the drain voltage. The capacity Crss is the capacity between the gate and the drain in the low side switching element. The capacity Ciss is the sum of the capacity between the gate and the source and the capacity between the gate and the drain in the low side switching element.

As a simple way, increasing the gate length increases the areas of the gate and the p type well layer facing the base region, and thereby increases the capacity Ciss. In such a case, the channel length is increased and thus the on-state resistance is increased. Therefore, as shown in FIG. 17, the source electrode 70 is disposed above the gate electrode 68 such that the electrode 70 hangs over the gate electrode 68 to cover at least 50% of the area of the gate electrode. This increases the capacity between the gate and the source, and increases the capacity Ciss. Thereby, it is possible to increase the capacity Ciss, without increasing the on-state resistance of the low side switching element 13. Consequently, it is possible to reduce the value "capacity Crss/capacity Ciss" in the low side switching element.

Figure 18:
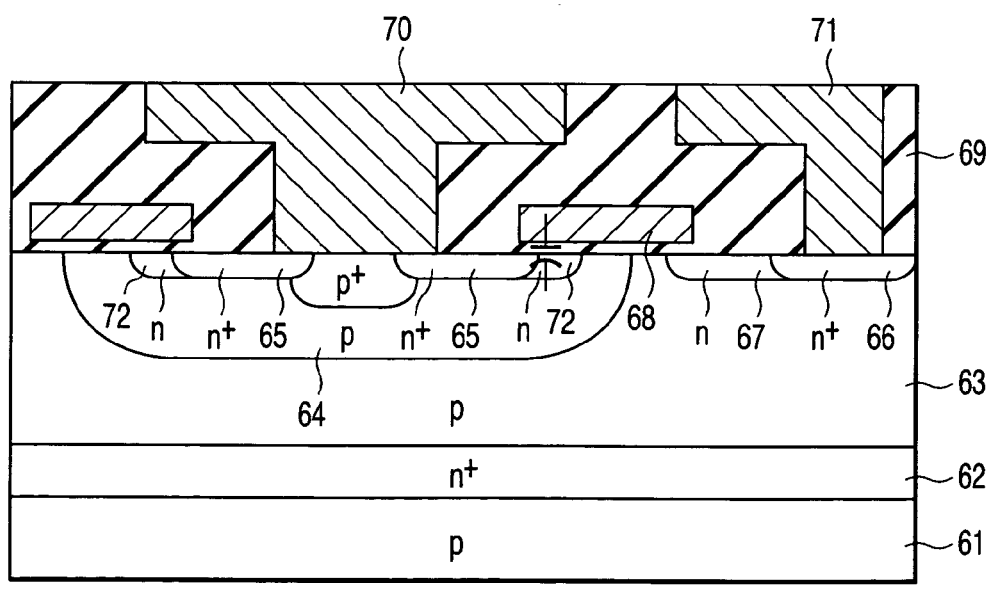
FIG. 18 is a cross-sectional view of a second example of the low side switching element in the DC-DC converter of the fifth embodiment.

FIG. 18 is a cross-sectional view of a second example of the low side switching element in the DC-DC converter of the fifth embodiment.

As shown in FIG. 18, an n type layer 72 is provided under a gate electrode 68, so as to contact a source region 65 of an $n^+$ type layer. This increases the gate length, and increases the capacity between the gate and the source without increasing the channel length. This structure can increase the capacity Ciss without increasing the on-state resistance of the low side switching element 13.

Figure 19A:
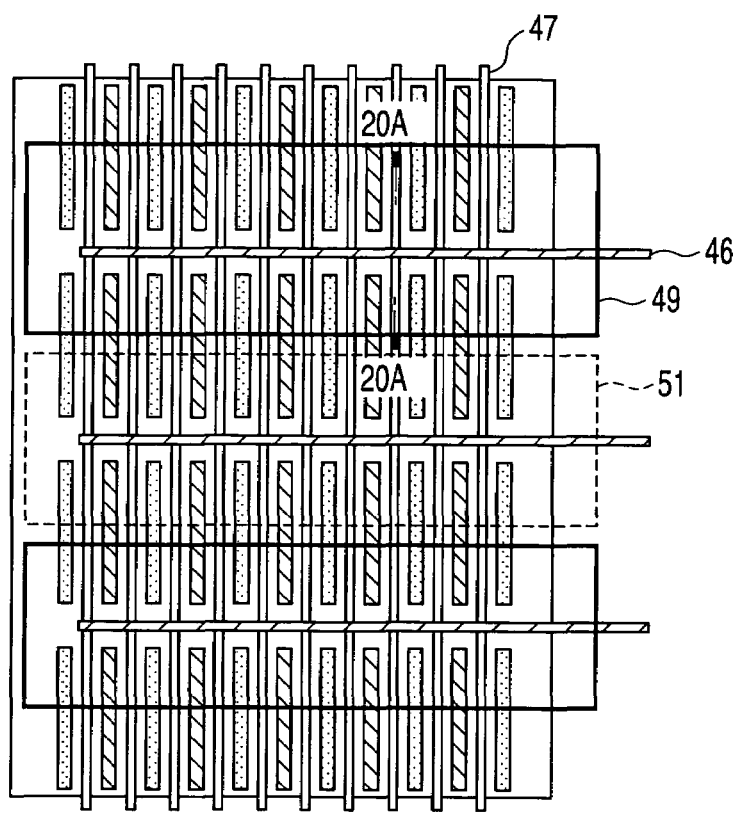
FIGS. 19A and 19B are cross-sectional views of other examples of a layout pattern in the fifth embodiment.
Figure 19B:
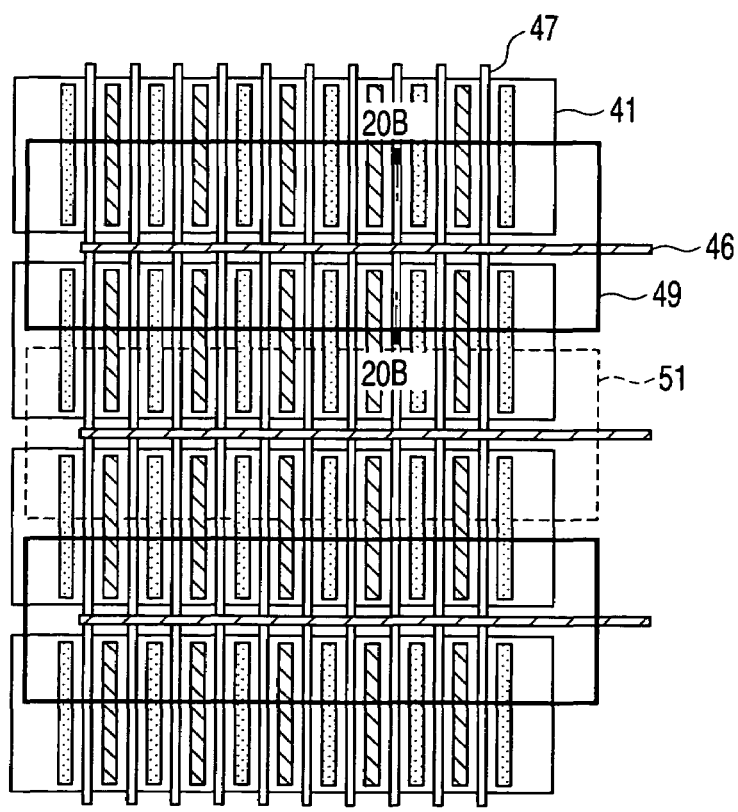
Figure 20A:
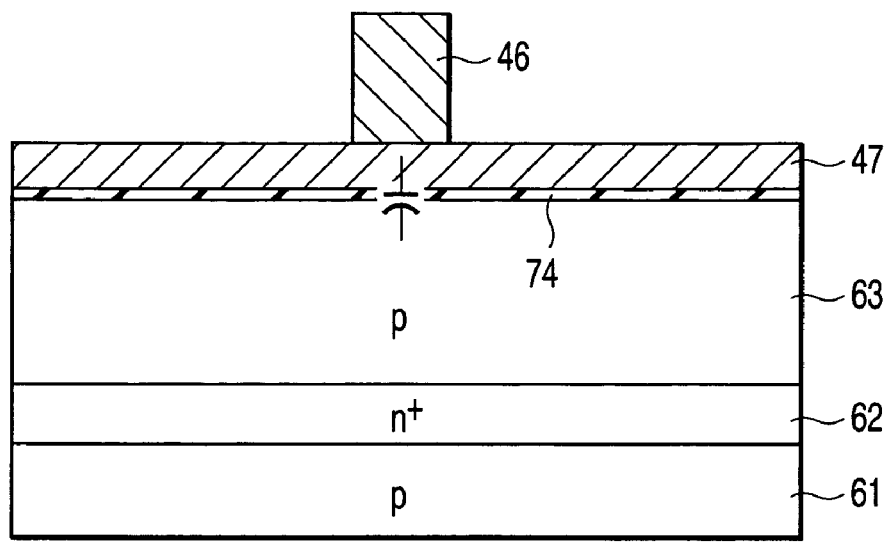
FIGS. 20A and 20B are cross-sectional views taken along lines 20A—20A and 20B—20B, respectively, in the respective layout patterns shown in FIGS. 19A and 19B.
Figure 20B:
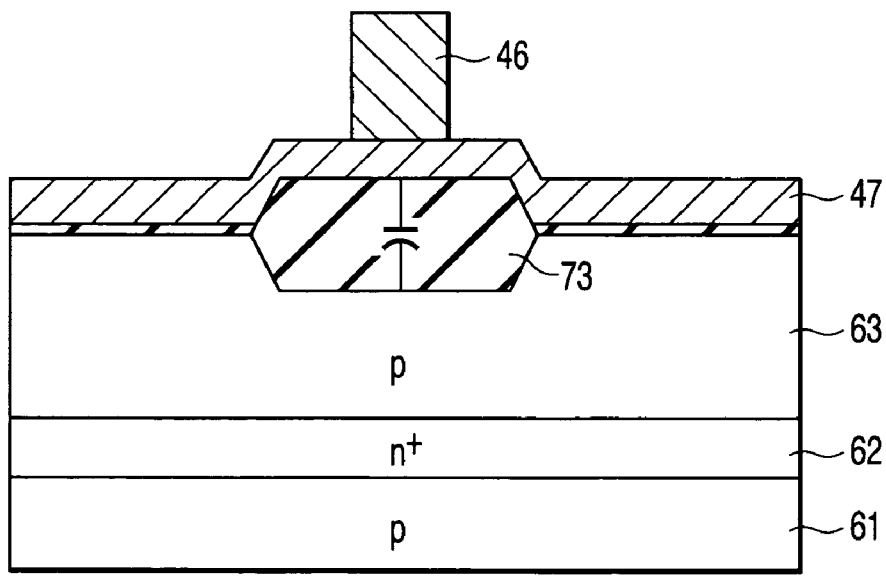

Although the examples shown in FIGS. 17 and 18 increase the capacity between the gate and the source by changing the device structure, the capacity between the gate and the source can be increased by contriving (changing) the layout pattern. FIGS. 19A and 19B illustrate the contrived layout pattern. FIG. 19A illustrates a region in which low side switching elements are formed, and FIG. 19B illustrates a region in which high side switching elements are formed. FIGS. 20A and 20B illustrate cross sections taken along line 20A—20A in FIG. 19 and line 20B—20B in FIG. 19B, respectively.

As shown in FIG. 20B, in the high side switching element, a field oxide film 73 directly under a gate wire 47 is thickened in a contact region of the gate wire 47 and the wire 46. In the meantime, as shown in FIG. 20A, in the low side switching element, an oxide film 74 directly under the gate wire 47 is thinned in a contact region of the gate wire 47 and the wire 46, to increase the capacity between the gate and the source. This structure can prevent self turn-on.

Next, the layout of the DC-DC converter of the fifth embodiment is explained.

Figure 21:
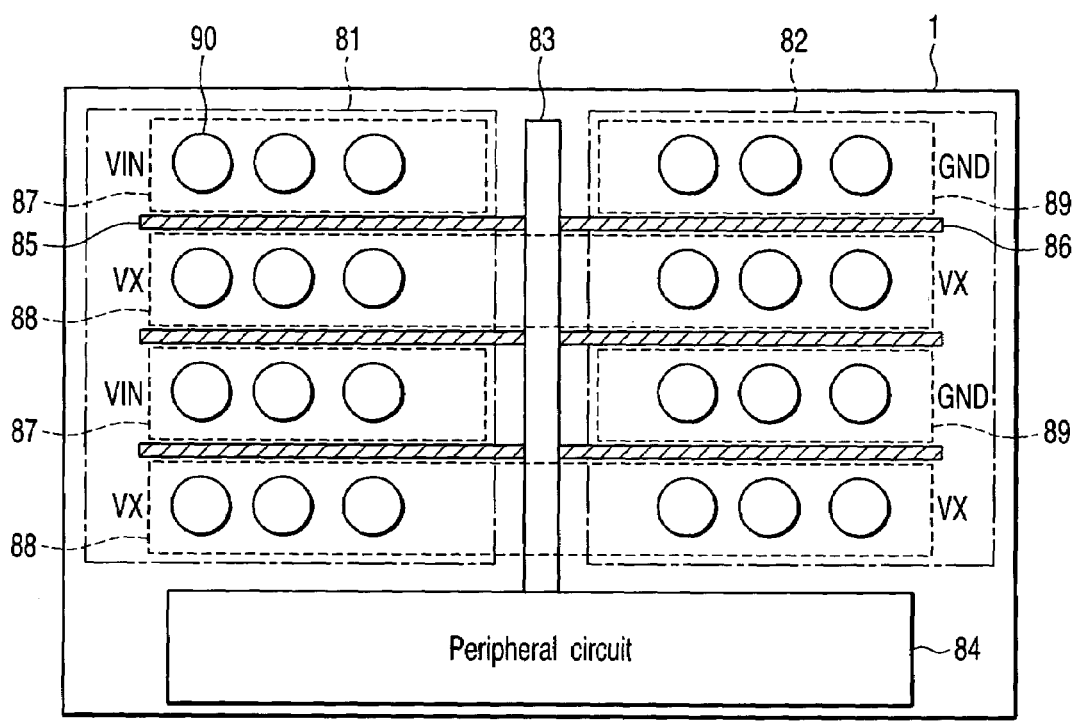
FIG. 21 is a layout diagram illustrating a structure of the DC-DC converter according to the fifth embodiment.

FIG. 21 is a layout diagram illustrating a specific structure example of high side switching elements, low side switching elements, and driver circuits in the DC-DC converter of the fifth embodiment.

As shown in FIG. 21, a high side element region 81, a low side element region 82, a gate wiring region 83, and a peripheral circuit 84 are arranged on the semiconductor device (chip) 1. In the high side element region 81, high side switching elements are formed and high side driver regions 85, in each of which a driver circuit that drives the high side switching elements is formed, are arranged. In the low side element region 82, low side switching elements are formed and low side driver regions 86, in each of which a driver circuit that drives the low side switching elements is formed, are arranged. The gate wiring region 83 is arranged between the high side element region 81 and the low side element region 82. In the gate wiring region 83, gate signal wire connected to the driver circuits is formed. The peripheral circuit 84 includes a control circuit, which controls the driver circuits that drive the high side switching elements and the low side switching elements, respectively.

First electrode layers 87 are formed above the high side element region 81 on the semiconductor device 1, and second electrode layers 88 are formed above the high side element region 81 and the low side element region 82 on the semiconductor device 1. Further, third electrode layers 89 are formed above the low side element region 82 on the semiconductor device 1.

The first electrode layers 87 are connected to one ends (drain electrodes if the high side switching elements are nMOSFETs) of current paths of the high side switching elements. An input voltage VIN is supplied to the first electrode layers 87. The second electrode layers 88 are connected to the other ends (source electrodes if the high side switching elements are nMOSFETs) of the current paths of the high side switching elements, and drains of the low side switching elements. The second electrode layers 88 have a voltage VX. The third electrode layers 89 are connected to sources of the low side switching elements. A ground potential GND is supplied to the third electrode layers 89.

A plurality of bumps 90 are formed on each of the first electrode layers 87, each of the second electrode layers 88, and each of the third electrode layers 89. The bumps 90 electrically connect the semiconductor device 1 to a printed circuit board or the like. This reduces the parasitic inductance in comparison with the case of routing wire, and reduces decrease in the conversion efficiency in the DC-DC converter.

Figure 22:
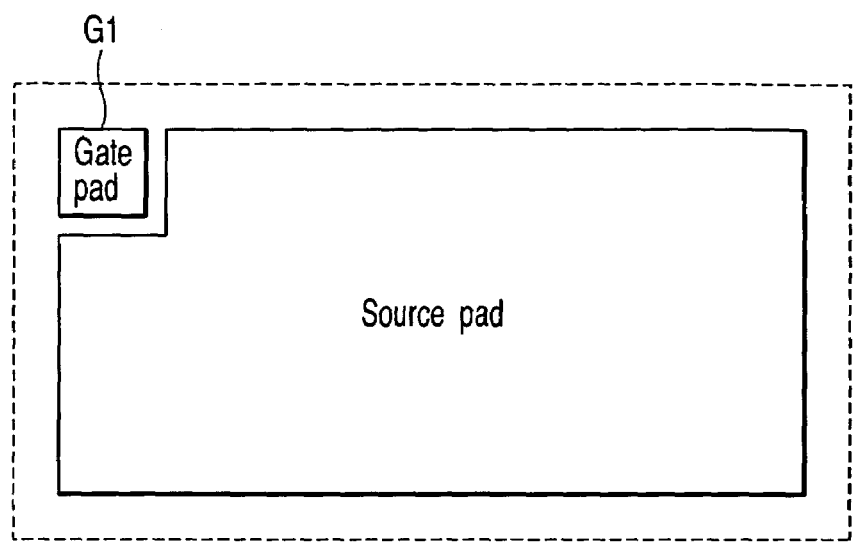
FIG. 22 is a layout diagram of a pad in a conventional low side switching element.

Further, if the low side switching elements have a large gate resistance, the effect of fixing the third electrode layers 89 to the ground potential GND is reduced. Therefore, the device becomes vulnerable to the influence of the voltage change (dv/dt), and self turn-on easily occurs. FIG. 22 illustrates a layout of a conventional low side switching element. In conventional low side switching elements, a gate pad G1 is disposed as shown in FIG. 22. However, since the conventional one only has a gate pad in one place, the gate routing inside the low side switching element is large, and thus the gate resistance becomes large. Further, since only one wire is used to connect the driver circuit and the gate pad of the low side switching element, the electric current concentrates on the wire and the wire resistance tends to increase.

Figure 24:
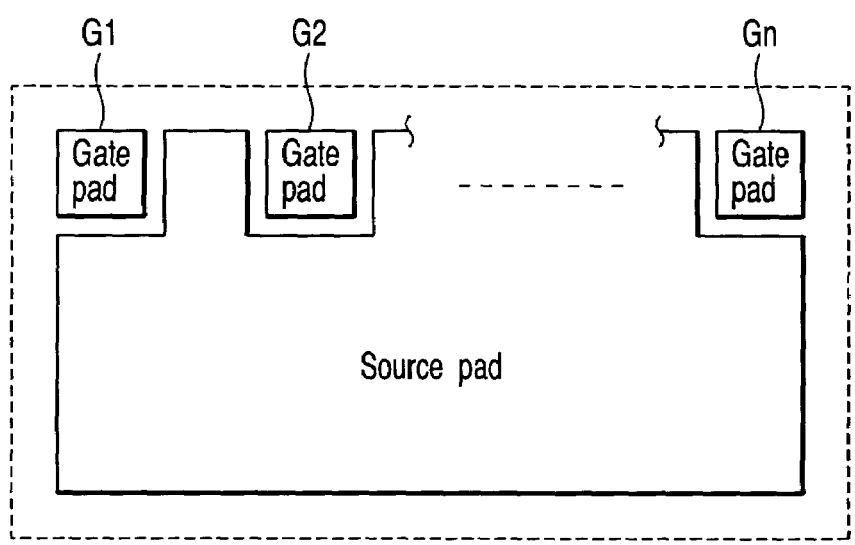
FIG. 24 is a layout diagram of a pad in the low side switching element in the fifth embodiment.
Figure 23:
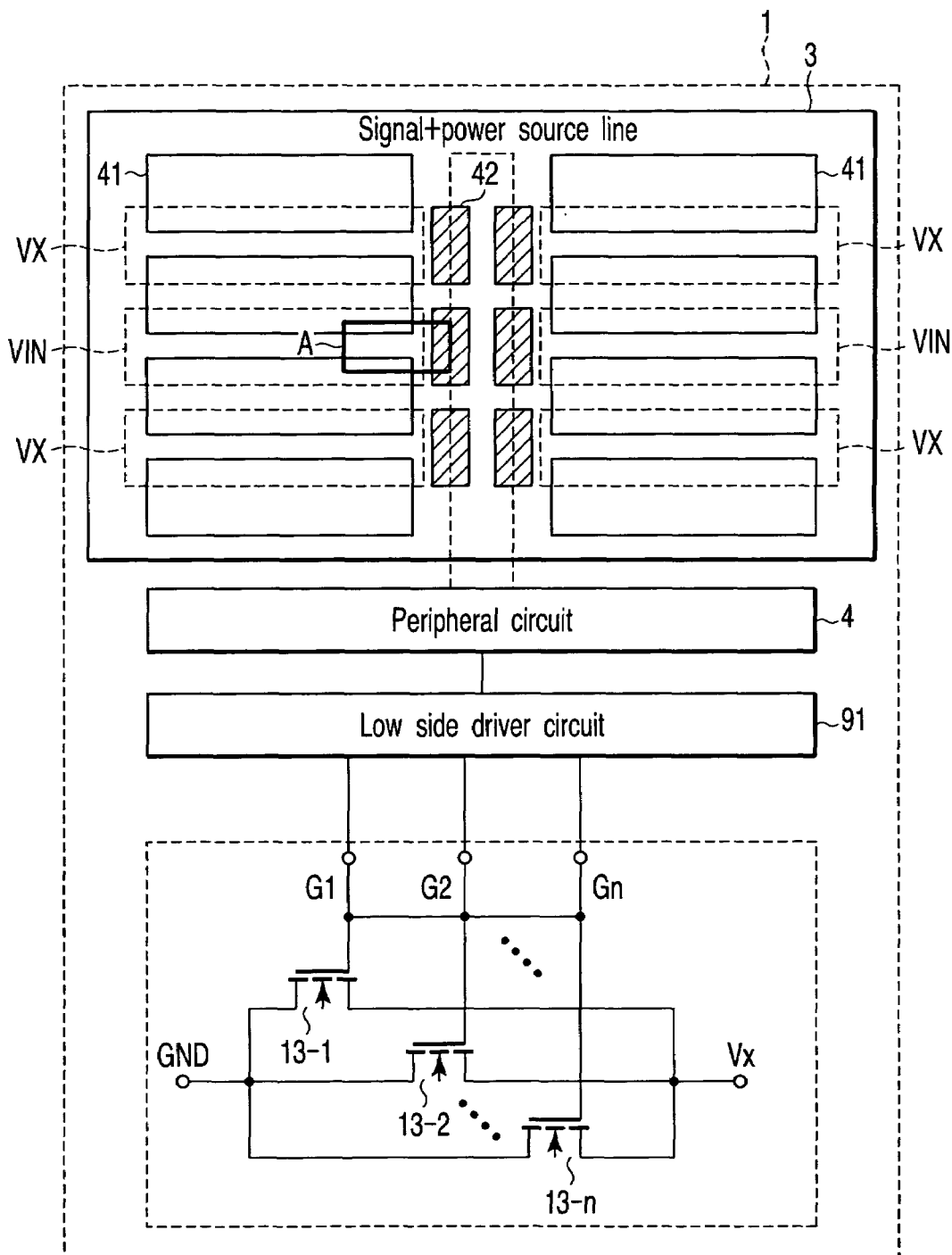
FIG. 23 is a layout diagram illustrating a structure of a first modification of the DC-DC converter according to the fifth embodiment.
Figure 25:
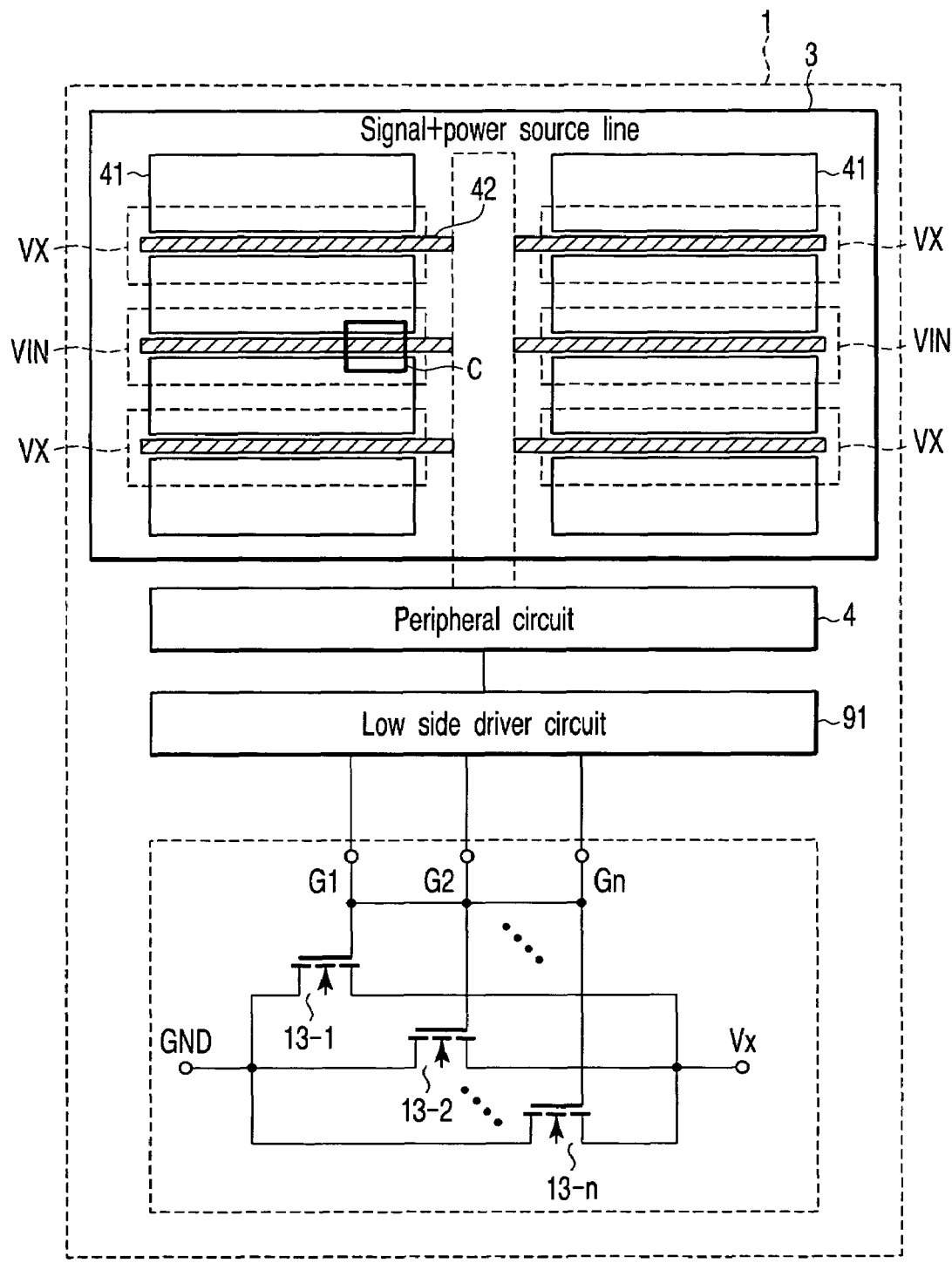
FIG. 25 is a layout diagram illustrating a second modification of the DC-DC converter according to the fifth embodiment.

Therefore, as shown in FIGS. 23, 24 and 25, gate electrodes G1, G2, ..., Gn are provided for low side switching elements 13-1, 13-2, ..., 13-n, respectively, to ease the current concentration on the wire connecting the driver circuit and the gate pad of the low side switching element and reduce the gate routing inside the low side switching element. Specifically, two or more gate electrodes of low side switching elements are formed. Further, a plurality of wires are formed to connect the driver circuit 91 and the gate pads G1, G2, ..., Gn of the low side switching elements. Furthermore, the peripheral circuit 4 is disposed in the central portion of the semiconductor substrate 1, to reduce routing of the wires connecting the driver circuit and the gate pads of the low side switching elements. This structure reduces the gate resistance of the low side switching elements, and reduces the influence by self turn-on.

According to the embodiments of the present invention, it is possible to provide a semiconductor deice which reduces the parasitic inductance and resistance and improve the conversion efficiency of the DC-DC converter.

The above embodiments can be carried out not only individually, but also in combination. Each of the above embodiments includes inventions of various stages, and it is possible to extract inventions of various stages therefrom, by properly combining plural constituent elements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a high side switching element formed on a first semiconductor substrate and having a current path to one end of which an input voltage is supplied, the other end of the current path being connected to an inductance;
   a driver circuit formed on the first semiconductor substrate, on which the high side switching element is formed, and driving the high side switching element; and
   a low side switching element formed on a second semiconductor substrate separate from the first semiconductor substrate, the low side switching element having a drain connected to the inductance and a source supplied with a reference potential.

2. The semiconductor device according to claim 1, the low side switching element being a vertical MOS field-effect transistor in which a current passes from a front surface to a rear surface of the second semiconductor substrate, and the high side switching element being a MOS field-effect transistor of a type different from that of the vertical MOS field-effect transistor.

3. The semiconductor device according to claim 2, the vertical MOS field-effect transistor including a trench MOS field-effect transistor.

4. The semiconductor device according to claim 1, the first semiconductor substrate and the low side switching element being contained in the same package.

5. The semiconductor device according to claim 1, the high side switching element and the driver circuit being two or more, and the high side switching elements being provided with the respective driver circuits which drive the switching elements.

6. The semiconductor device according to claim 5, an area of at least 50% of each of the driver circuits being located in a region in which the high side switching elements are formed.

7. The semiconductor device according to claim 5, each of the driver circuits being interposed between areas in each of which the high side switching elements are formed.

8. The semiconductor device according to claim 1, further comprising a control circuit which controls the high side switching elements to either an on state or an off state, according to a current flowing through the inductance or an output voltage.

9. The semiconductor device according to claim 1, further comprising:
 a first electrode layer which is connected to the one end of the current path of the high side switching element and formed above the high side switching element;
 a second electrode layer which is connected to the other end of the current path of the high side switching element, and formed above the high side switching element; and
 bumps formed on each of the first electrode layer and the second electrode layer.

10. The semiconductor device according to claim 1, the high side switching element and the low side switching element including a lateral MOS field-effect transistor.

11. The semiconductor device according to claim 1, the semiconductor device being a DC-DC converter which transforms a direct-current voltage.

12. A semiconductor device, comprising:
 high side switching elements formed on a semiconductor substrate and each having a current path, the current path one end of which is supplied with an input voltage and the other end of which is connected to an inductance;
 high side driver circuits formed on the semiconductor substrate on which the high side switching elements are formed, and driving the high side switching elements;
 a low side switching element formed on the semiconductor substrate on which the high side switching elements and the high side driver circuits are formed, and having a drain connected between the other end of the current path of the high side switching element and the inductance, and a source supplied with a reference potential; and
 a low side driver circuit formed on the semiconductor substrate on which the high side switching elements, the high side driver circuits and the low side switching element are formed, and driving the low side switching element,
 wherein the high side switching elements are provided with the high side driver circuits, respectively.

13. The semiconductor device according to claim 12, further comprising a control circuit which controls the high side switching elements to either an on state or an off state, according to a current flowing through the inductance or an output voltage.

14. The semiconductor device according to claim 12, an area of at least 50% of each of the high side driver circuits being located in a region in which the high side switching elements are formed.

15. The semiconductor device according to claim 12, each of the high side driver circuits being interposed between areas in each of which the high side switching elements are formed.

16. The semiconductor device according to claim 12, further comprising:
 a first electrode layer which is connected to the one end of the current path of the high side switching element and formed above the high side switching element;
 a second electrode layer which is connected to the other end of the current path of the high side switching element and to the drain of the low side switching element;
 a third electrode layer connected to the source of the low side switching element; and
 bumps formed on each of the first electrode layer, the second electrode layer and the third electrode layer.

17. The semiconductor device according to claim 12, the high side switching element and the low side switching element including a lateral MOS field-effect transistor.

18. The semiconductor device according to claim 12, wherein the low side switching element includes a gate electrode and a source electrode, the source electrode is a source electrode formed nearest to a surface of the semiconductor substrate, and the source electrode is disposed to cover at least 50% of an area of the gate electrode.

19. The semiconductor device according to claim 12, the semiconductor device being a DC-DC converter which transforms a direct-current voltage.

20. The semiconductor device according to claim 12, wherein at least one area in any one of the high side driver circuits and the low side driver circuit is located in a minimum rectangular region including either of the high side switching elements and the low side switching element.

21. The semiconductor device according to claim 20, wherein an area of at least 50% of the high side driver circuits is located in the minimum rectangular region including the high side switching elements.

22. The semiconductor device according to claim 20, wherein at least one area in the low side driver circuit is located in the minimum rectangular region including the low side switching element.

23. A semiconductor device comprising:
 a first power MOS field-effect transistor formed in a first region on a semiconductor substrate;
 a second power MOS field-effect transistor formed in a second region on the semiconductor substrate; and
 a first and a second switching circuits formed on the semiconductor substrate between the first region and the second region, and driving the first and the second power MOS field-effect transistors, respectively.

24. The semiconductor device according to claim 23, wherein respective source electrodes of the first and the second power MOS field-effect transistors are formed above the first and the second switching circuits.

25. The semiconductor device according to claim 23, the first and second switching circuits being arranged adjacent to the first and the second power MOS field-effect transistors, and a wire which supplies outputs of the first and the second switching circuits being formed between the first region in which the first power MOS field-effect transistor is formed and the second region in which the second power MOS field-effect transistor is formed.

26. The semiconductor device according to claim 23, the semiconductor device being a DC-DC converter which transforms a direct-current voltage.

27. A semiconductor device comprising:
high side switching elements formed on a semiconductor substrate and each having a current path, the current path one end of which is supplied with an input voltage and the other end of which is connected to an inductance;
a high side driver circuit formed on the semiconductor substrate on which the high side switching elements are formed, and driving the high side switching elements;
low side switching elements formed on the semiconductor substrate on which the high side switching elements and the high side driver circuit are formed, and each having a drain connected between the other end of the current path of the high side switching element and the inductance, and a source supplied with a reference potential; and
a low side driver circuit formed on the semiconductor substrate on which the high side switching elements, the high side driver circuit and the low side switching elements are formed, and driving the low side switching elements,
wherein at least one area in any one of the high side driver circuit and the low side driver circuit is located in a minimum rectangular region including either of the high side switching elements and the low side switching elements.

28. The semiconductor device according to claim 27, wherein the one area is an area of at least 50%.

29. The semiconductor device according to claim 28, wherein the one area is an area of the high side driver circuit and the minimum rectangular region includes the high side switching elements.

* * * * *